(12) United States Patent
Kamikubo

(10) Patent No.: US 9,159,535 B2
(45) Date of Patent: Oct. 13, 2015

(54) MULTI CHARGED PARTICLE BEAM WRITING METHOD, AND MULTI CHARGED PARTICLE BEAM WRITING APPARATUS

(71) Applicant: NuFlare Technology, Inc., Yokohama (JP)

(72) Inventor: Takashi Kamikubo, Tokyo (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/327,900

(22) Filed: Jul. 10, 2014

(65) Prior Publication Data

US 2015/0041672 A1    Feb. 12, 2015

(30) Foreign Application Priority Data

Aug. 8, 2013    (JP) .................................. 2013-165493

(51) Int. Cl.
*H01J 37/00*    (2006.01)
*H01J 37/317*    (2006.01)

(52) U.S. Cl.
CPC ..... *H01J 37/3177* (2013.01); *H01J 2237/0435* (2013.01); *H01J 2237/31725* (2013.01); *H01J 2237/31798* (2013.01)

(58) Field of Classification Search
USPC ...... 250/306, 307, 396 R, 397, 398, 396 ML, 250/492.1, 492.2, 492.3
See application file for complete search history.

(56) References Cited

U.S. PATENT DOCUMENTS

| | | | |
|---|---|---|---|
| 6,661,015 B2 | 12/2003 | Chalupka et al. | |
| 7,772,574 B2 | 8/2010 | Stengl et al. | |
| 8,710,467 B2 * | 4/2014 | Yoshikawa et al. | ...... 250/492.22 |
| 2009/0146082 A1 | 6/2009 | Stengl et al. | |

FOREIGN PATENT DOCUMENTS

JP    2008-521221    6/2008

* cited by examiner

*Primary Examiner* — Nicole Ippolito
*Assistant Examiner* — Hanway Chang
(74) *Attorney, Agent, or Firm* — Oblon, McClelland, Maier & Neustadt, L.L.P.

(57) ABSTRACT

A multi charged particle beam writing apparatus includes a beam forming member, where first openings for writing and second openings not for writing around the first openings are formed, to form multiple beams for writing and to form multiple beams for measurement, plural mark members on a blanking aperture member arranged close to the height position where crossover is formed, a measurement unit to measure positions of the multiple beams for measurement by the plural mark members, and a correction unit to correct a voltage for making a "beam on" state applied to one of the plural blankers, in order to correct a position deviation amount of a measured position.

17 Claims, 10 Drawing Sheets

MULTI CHARGED PARTICLE BEAM WRITING METHOD, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2013-165493 filed on Aug. 8, 2013 in Japan, the entire contents of which are incorporated herein by reference.

BACKGROUND OF THE INVENTION

1. Field of the Invention

The present invention relates to a multi charged particle beam writing apparatus and a multi charged particle beam writing method. More specifically, for example, the present invention relates to drift correction of multiple beams.

2. Description of Related Art

The lithography technique that advances miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

In a variable shaping type (VSB) electron beam writing that uses a single electron beam for writing, the more the pattern shape is complicated, the more it becomes necessary to divide the pattern into fine shot figures, so that the writing time becomes long. In order to solve this problem, it could be thought to shorten the writing time by increasing a beam current density so as to compensate the increase in the number of shots. However, if this method is employed, since the influence of resist heating and the like becomes large, there is also a limit to this method.

Now, think of a writing apparatus using multiple beams (multi-beams). Compared with the case of writing a pattern by using a single electron beam, since it is possible to emit multiple beams at a time in multiple writing, the throughput can be greatly increased. In a writing apparatus employing a multi-beam system, for example, multiple beams are formed by letting an electron beam emitted from an electron gun assembly pass through a mask with a plurality of holes arranged in a matrix, blanking control is performed for each of the multiple beams, and each unblocked beam irradiates a desired position on a target object or "sample".

In the case of a conventional single beam writing apparatus, the number of shaping aperture opening portions for focusing a shot image (pattern) on the substrate used as a target object is one. By contrast, in the case of a multiple beam writing apparatus, a plurality of shaping aperture openings are needed. Consequently, the size of a shaping aperture plate is large. The blanker array for blanking-controlling each beam of multiple beams may be united with the shaping aperture plate. Therefore, the structure becomes complicated. Thus, since the shaping aperture portion is large and the structure is complicated, a multi charge particle beam writing apparatus is easily affected by adherent contamination and beam drift occurs easily compared with a single beam writing apparatus. For example, in the case of a single beam writing apparatus of a variable shaped beam system (VSB system), the position of a first shaping aperture image having passed the first shaping aperture can be adjusted on the second shaping aperture by a deflector. Therefore, the position accuracy of the first shaping aperture can be corrected. However, in the case of the multi-beam writing apparatus, since the beam shaping is performed once, the position of the shaping aperture opening greatly affects the position accuracy when written on a target object surface. Therefore, if beam drift occurs at the shaping section of multiple beams, the position accuracy of each beam is degraded. When beam drift occurs, in addition to that the position of each beam is displaced, another problem may be generated in that a beam in the "on" state is partially blocked by the blanking aperture, thereby changing the dose reaching the target object. Thus, it is important to perform measurement and correction of the drift at the shaping section of multiple beams.

Conventionally, in order to increase the position accuracy of multiple beams at the target object surface, there has been suggested a technique that a beam for measurement, namely a beam to be measured, is shaped and its middle image is detected near the target object surface to correct the beam position (refer to, e.g., Japanese Patent Application Laid-open (JP-A) No. 2008-521221). However, with this technique, it is difficult to measure the amount of drift at the shaping section of the multiple beams, and thus correction cannot be performed sufficiently.

BRIEF SUMMARY OF THE INVENTION

In accordance with one aspect of the present invention, a multi charged particle beam writing apparatus includes: an emission unit configured to emit a charged particle beam; a beam forming member, in which a plurality of first openings for writing and a plurality of second openings not for writing around the plurality of first openings are formed, configured to form multiple beams for writing by letting a region including a whole of the plurality of first openings and the plurality of second openings be irradiated with the charged particle beam and letting portions of the charged particle beam respectively pass through a corresponding opening of the plurality of first openings, and to form multiple beams for measurement by letting portions of the charged particle beam respectively pass through the plurality of second openings; a blanking plate having a plurality of blankers configured to respectively perform blanking deflection for a corresponding beam in the multiple beams for writing having passed through the plurality of first openings and the multiple beams for measurement having passed through the plurality of second openings of the beam forming member; a converging lens configured to converge the multiple beams for writing and the multiple beams for measurement which have passed through the blanking plate; a blanking aperture member, which is arranged close to a height position where the multiple beams for writing and the multiple beams for measurement form a crossover and in which a limiting aperture is formed, configured to block each beam in the multiple beams for writing, which was deflected to be in a "beam off" state by one of the plurality of blankers, at a position displaced from the limiting aperture, and to let each beam to be in a "beam on" state pass through the limiting aperture; a plurality of mark members arranged on the blanking aperture member, which is arranged close to the height position where the crossover is formed, or arranged between the blanking aperture member and the blanking plate; a measurement unit configured to measure positions of the multiple beams for measurement by using the plurality of mark members; and a correction unit configured to correct a voltage for making a "beam on" state to be applied to one of the plurality of blankers, which performs blanking deflection for one of the multiple beams for writing, in order to correct a position deviation amount of a measured position in the positions of the multiple beams for measurement.

In accordance with another aspect of the present invention, a multi charged particle beam writing method includes: emitting a charged particle beam; forming multiple beams for writing, by using a beam forming member in which a plurality of first openings for writing and a plurality of second openings not for writing around the plurality of first openings are formed, by letting a region including a whole of the plurality of first openings and the plurality of second openings be irradiated with the charged particle beam and letting portions of the charged particle beam respectively pass through a corresponding opening of the plurality of first openings, and forming multiple beams for measurement by letting portions of the charged particle beam respectively pass through the plurality of second openings; performing blanking deflection for a corresponding beam in the multiple beams for writing having passed through the plurality of first openings and the multiple beams for measurement having passed through the plurality of second openings, by using a plurality of blankers arranged in a blanking plate; converging the multiple beams for writing and the multiple beams for measurement which have passed through the blanking plate; blocking each beam in the multiple beams for writing, which was deflected to be in a "beam off" state by one of the plurality of blankers, at a position displaced from a limiting aperture, and letting each beam to be in a "beam on" state pass through the limiting aperture, by using a blanking aperture member which is placed close to a height position where the multiple beams for writing and the multiple beams for measurement form a crossover and in which the limiting aperture is formed; measuring positions of the multiple beams for measurement by using a plurality of mark members arranged on the blanking aperture member placed close to the height position where the crossover is formed, or arranged between the blanking aperture member and the blanking plate; and correcting a voltage for making a "beam on" state to be applied to one of the plurality of blankers, which performs blanking deflection for one of the multiple beams for writing, in order to correct a position deviation amount of a measured position in the positions of the multiple beams for measurement.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used.

In the embodiments, there will be described a writing apparatus and method that can perform drift correction at the shaping section of multiple beams in multi-beam writing.

First Embodiment

Figure 1:
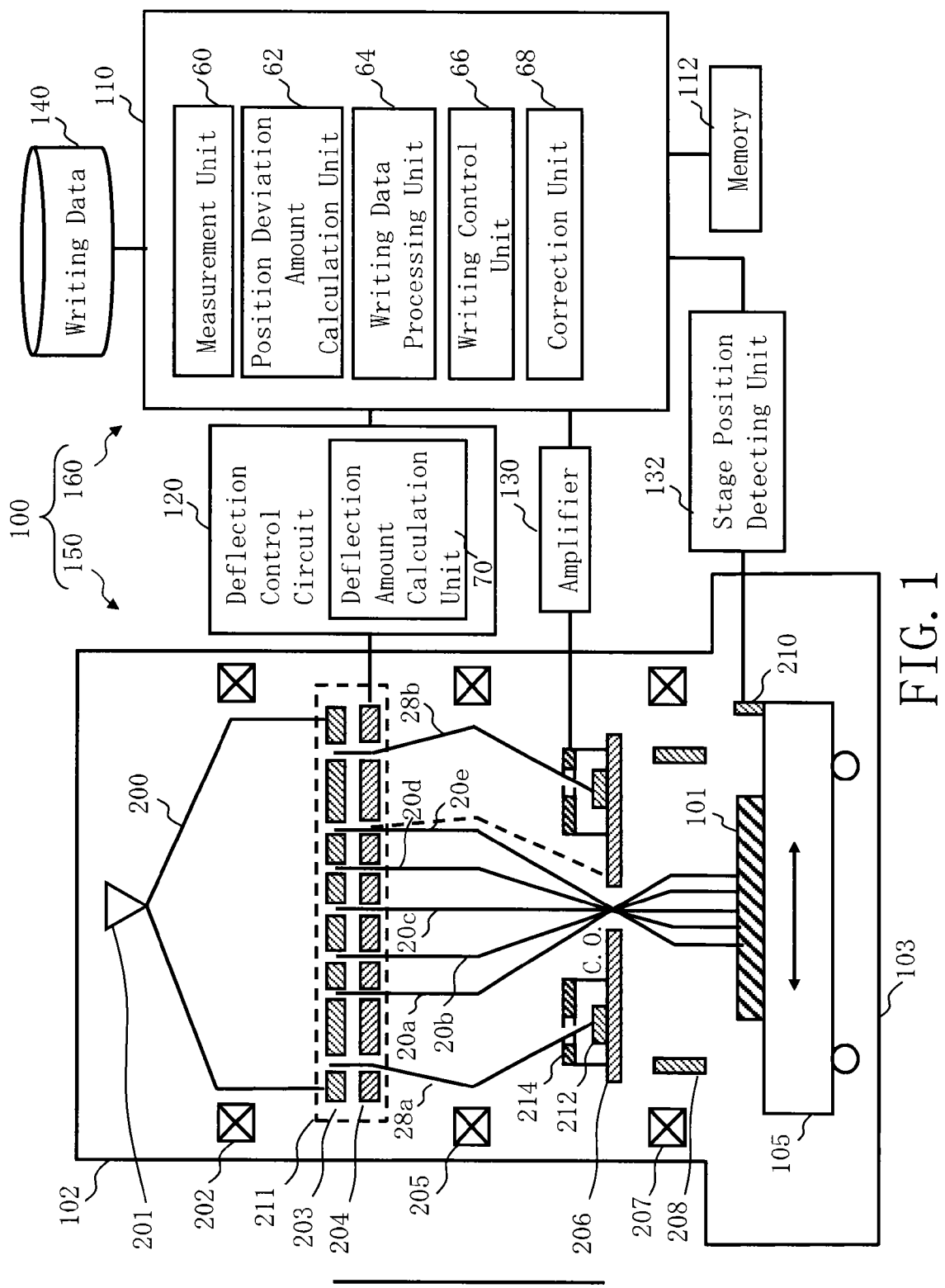
FIG. 1 is a schematic diagram showing the configuration of a writing apparatus according to the first embodiment.

FIG. 1 is a schematic diagram showing a configuration of a writing apparatus according to the first embodiment. In FIG. 1, a writing (or "drawing") apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, a blanking aperture array (BAA) member 211, a converging lens 205, a limiting aperture member 206, an objective lens 207, and a deflector 208. The BAA member 211 is composed of laminated shaping aperture member 203 and blanking plate 204, where the shaping aperture member 203 is the upper side. On the limiting aperture member 206, there are arranged a plurality of mark members 212 and a plurality of detectors 214 each arranged for each mark member 212. In the writing chamber 103, there is arranged an XY stage 105. On the XY stage 105, there is placed a target object or "sample" 101 such as a mask serving as a writing target substrate when performing writing. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, further, a mirror 210 for measuring the position of the XY stage 105 is arranged.

The control unit 160 includes a control computer 110, a memory 112, a deflection control circuit 120, an amplifier 130, a stage position detection unit 132, and a storage device 140 such as a magnetic disk drive. The control computer 110, the memory 112, the deflection control circuit 120, the amplifier 130, the stage position detection unit 132, and the storage device 140 are mutually connected through a bus (not shown). Writing data is input into the storage device 140 (storage unit) from the outside to be stored therein. The DAC amplifier 130 is connected to the detector 214. The deflection control circuit 120 is connected to the blanking plate 204.

In the control computer 110, there are arranged a measurement unit 60, a position deviation amount calculation unit 62, a writing data processing unit 64, a writing control unit 66, and a correction unit 68. Each function, such as the measurement unit 60, the position deviation amount calculation unit 62, the writing data processing unit 64, the writing control unit 66, and the correction unit 68 may be configured by hardware such as an electronic circuit, or by software such as a program implementing these functions. Alternatively, they may be configured by a combination of software and hardware. Data which is input and output to/from the measurement unit 60, the position deviation amount calculation unit 62, the writing data processing unit 64, the writing control unit 66, or the correction unit 68, and data being calculated are stored in the memory 112 each time.

In the deflection control circuit 120, there is arranged a deflection amount calculation unit 70. The function such as the deflection amount calculation unit 70 may be configured by hardware such as an electronic circuit, or by software such as a program implementing these functions. Alternatively, it may be configured by a combination of software and hardware. Data which is input and output to/from the deflection amount calculation unit 70, and data being calculated are stored in a memory (not shown) each time.

FIG. 1 shows a configuration necessary for explaining the first embodiment. Other configuration elements generally necessary for the writing apparatus 100 may also be included.

Figure 2:
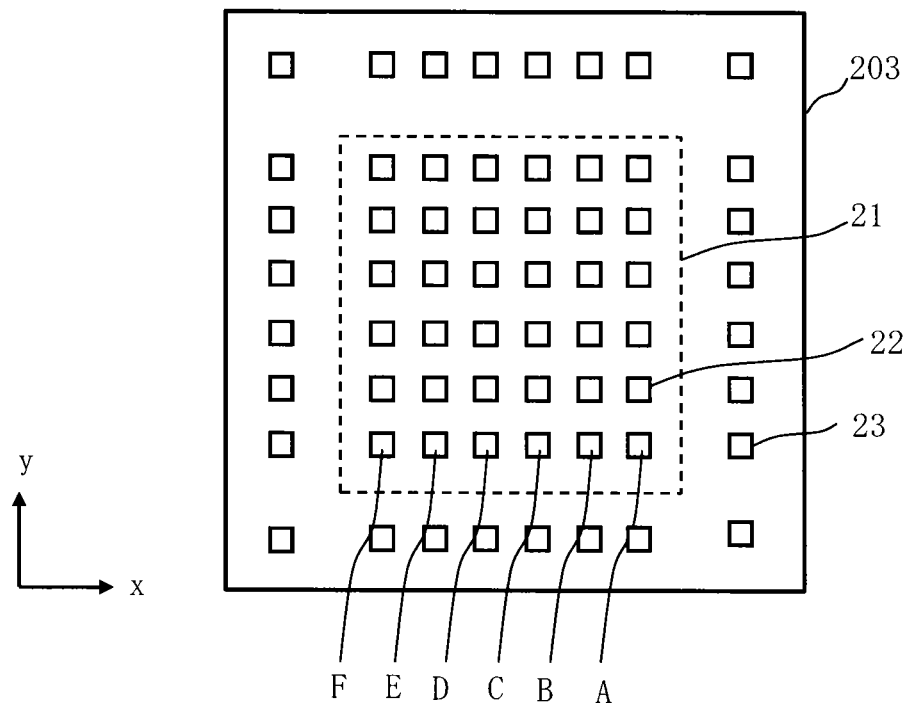
FIG. 2 is a conceptual diagram showing the configuration of an aperture member according to the first embodiment.

FIG. 2 is a conceptual diagram showing a configuration of an aperture member according to the first embodiment. In FIG. 2, holes (openings) 22 (a plurality of first openings) are formed at a predetermined arrangement pitch, in the shape of a matrix, in a writing multi-beam forming region 21 at the central part in the shaping aperture member 203 (an example of a beam forming member) wherein m×n (m≥2, n≥2) holes 22 are arranged in m columns in the vertical direction (the y direction) and n rows in the horizontal direction (the x direction). In FIG. 2, holes 22 of 6 (rows)×6 (columns) are formed, for example. The holes 22 are quadrangles, such as squares, of the same dimensions and shape. Alternatively, the holes may be circles of the same circumference. Here, there is shown an example of each row having six holes 22 from A to F in the x direction. Multi-beams 20 are formed by letting portions of an electron beam 200 respectively pass through a corresponding hole of a plurality of holes 22. Here, there is shown the case where the holes 22 are arranged in two or more columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2 where the holes are aligned in a grid. It is also preferable to arrange the holes 22 such that the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

In FIG. 2, a plurality of holes 23 (a plurality of second openings), not to be used for writing (but to be used for measuring), are formed around the circumference of a plurality of holes 22 (that is, the circumference of the writing multi-beam forming region 21). A plurality of holes 23 are formed so that they may surround a plurality of holes 22.

Figure 3:
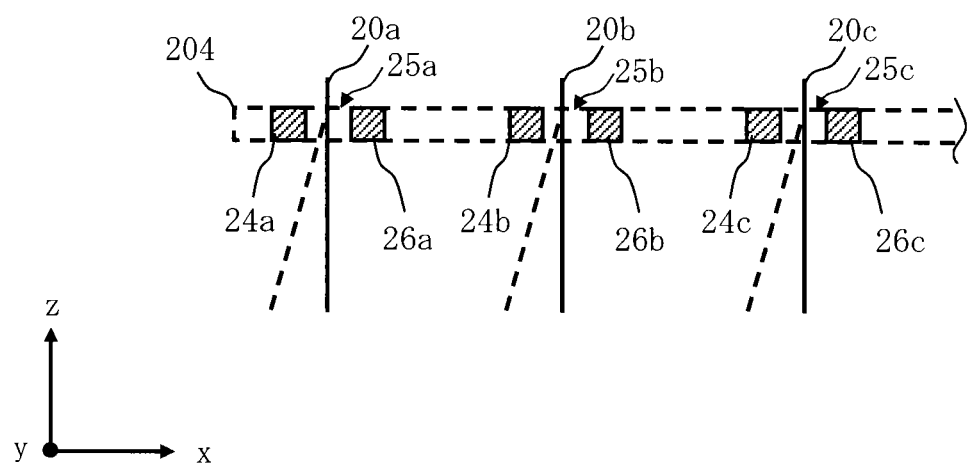
FIG. 3 is a sectional view showing the structure of a blanking plate according to the first embodiment.
Figure 4:
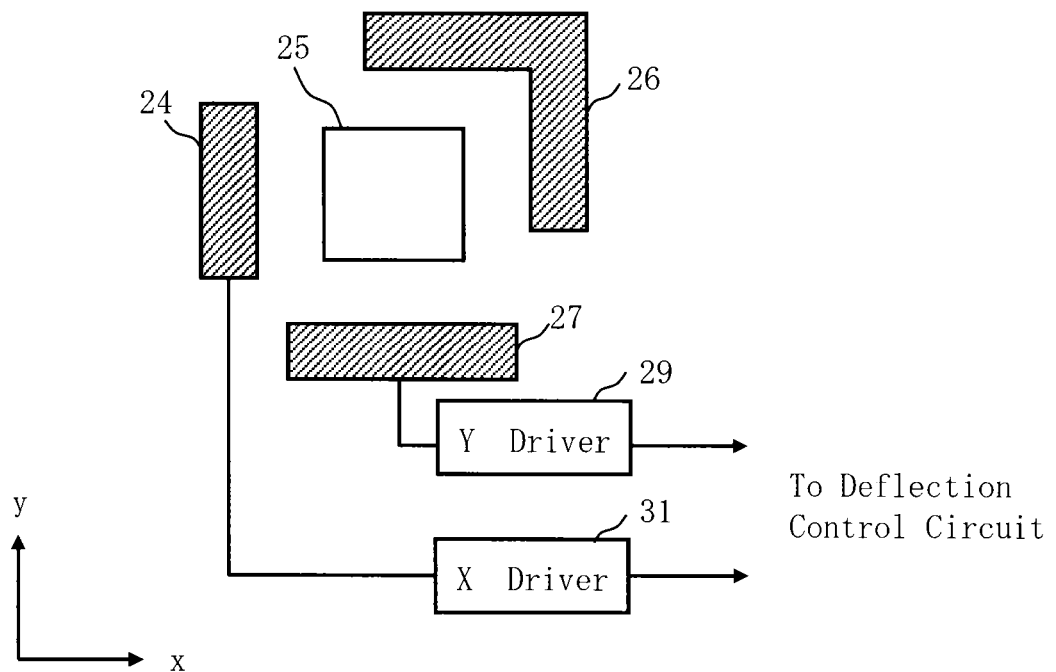
FIG. 4 is a top view showing an example of the structure of one set of blankers of a blanking plate according to the first embodiment.

FIG. 3 is a sectional view showing the structure of a blanking plate according to the first embodiment. The example of FIG. 3 shows a y direction section. FIG. 4 is a top view showing an example of the structure of one set of blankers of the blanking plate according to the first embodiment. In the blanking plate 204, a quadrangular passage hole 25 is formed to be corresponding to the arrangement position of each of the holes 22 and 23 of the shaping aperture member 203, and one set of electrodes 24, 26, and 27 (blanker), for example, is arranged for each passage hole 25. It is preferable that the size of the passage hole 25 is formed to be a little larger than the sizes of the holes 22 and 23. Thereby, the shape and size of each beam shaped by the holes 22 and 23 can be maintained. The electrode 26 is arranged so that it may cover one of the sides in the x direction and one of the sides in the y direction of the passage hole 25, and is connected to a ground potential. The electrode 24 is arranged at the other side of the sides in the x direction of the passage hole 25 so that a potential difference may be generated in the x direction with respect to the electrode 26. The electrode 27 is arranged at the other side of the sides in the y direction of the passage hole 25 so that a potential difference may be generated in the y direction with respect to the electrode 26. An x driver 31 which applies a voltage for generating a potential difference in the x direction is connected to the electrode 24. A y driver 29 which applies a voltage for generating a potential difference in the y direction is connected to the electrode 27. The x driver 31 and the y driver 29 are connected to the deflection control circuit 120. The electron beams 20 respectively passing through a corresponding passage hole 25 are respectively deflected in the x direction by the voltage applied to the two electrodes 24 and 26 being a pair. Similarly, the electron beams 20 respectively passing through a corresponding passage hole 25 are respectively deflected in the y direction by the voltage applied to the two electrodes 27 and 26 being a pair. Blanking control is performed by the deflection in the x direction and/or the y direction. A plurality of blankers are arranged such that a corresponding beam can be respectively deflected in at least two directions being not parallel, in the x and y directions in this case. Thus, a plurality of blankers respectively perform blanking deflection for a corresponding beam in the multiple beams having passed through a plurality of holes 22 (openings) of the shaping aperture member 203.

As described above, in the blanking plate 204, there are arranged a plurality of blankers which respectively perform blanking deflection for a corresponding beam in the multiple beams 20 for writing which have passed through the holes 22 and in the multiple beams for measurement which have passed through the holes 23 of the shaping aperture member 203.

Figure 5:
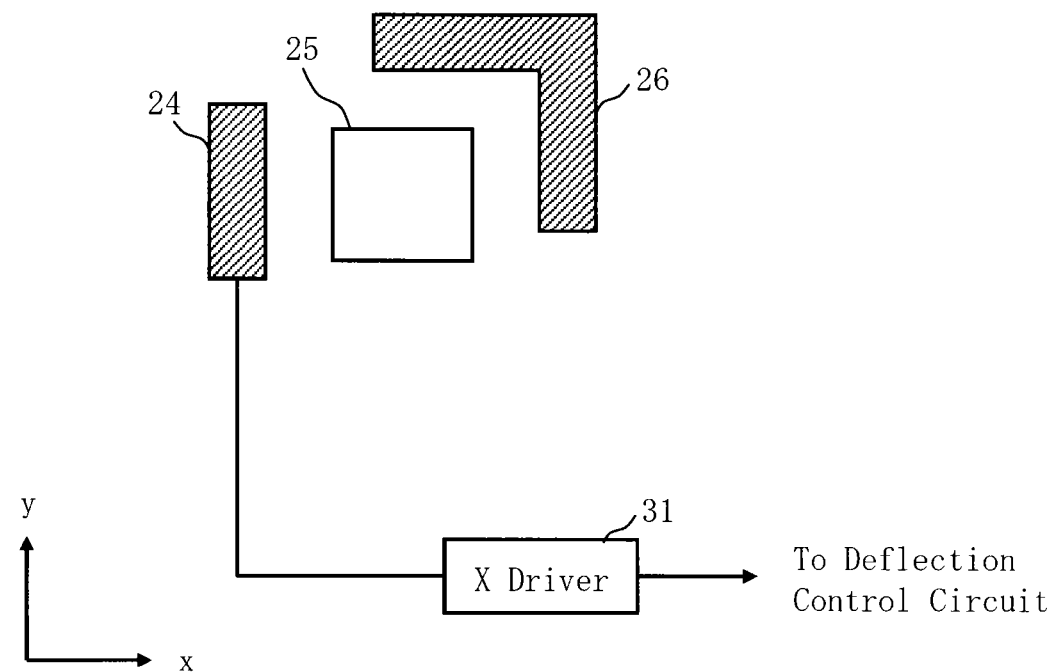
FIG. 5 is a top view showing another example of the structure of one set of blankers of a blanking plate according to the first embodiment.

FIG. 5 is a top view showing another example of the structure of one set of blankers of the blanking plate according to the first embodiment. In the example of FIG. 4, it is formed such that each beam can be deflected in the x direction and the y direction, but however, it is not limited thereto. While the drift correction to be described later is restricted to correction in one direction, it is also preferable that one set of two electrodes 24 and 26 (blanker) is arranged for each passage hole 25 as shown in FIG. 5, for example. In the example of FIG. 5, the electrode 24 is arranged at the other side of the sides in the x direction of the passage hole 25 so that a potential difference may be generated in the x direction with respect to the electrode 26. The x driver 31 which applies a voltage for generating a potential difference in the x direction is connected to the electrode 24. The x driver 31 is connected to the deflection control circuit 120. It should be understood that, instead of the electrode 24, the electrode 27 which generates a potential difference in the x direction may be arranged at each passage hole 25.

Writing operations are controlled by the writing control unit 66. The electron beam 200 emitted from the electron gun assembly 201 (emission unit) almost perpendicularly illuminates the region including the whole of a plurality of holes 22 and 23 of the aperture member 203 by the illumination lens 202. For example, a plurality of quadrangular electron beams (multiple beams) 20a to 20e for writing are formed by letting portions of the electron beam 200 respectively pass through a corresponding hole of the plurality of holes 22 of the aperture member 203. The multiple beams 20a to 20e respectively pass through a corresponding blanker of the blanking plate 204. Each blanker deflects (performs blanking deflection) each of the electron beams 20 which respectively pass therethrough. The multiple beams 20a to 20e having passed through the blanking plate 204 are converged by the converging lens 205, and advance toward a hole at the center of the limiting aperture member 206. At this point, the electron beam 20, which was deflected to be in the "beam off" state by the blanker of the blanking plate 204, is displaced from the hole at the center of the limiting aperture member 206 (blanking aperture member) and blocked at the position displaced from the center by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in the "beam off" state by each of a plurality of blankers. Then, a beam for one shot is formed by a beam which has been formed during from the "beam on" state to the "beam off" state and has passed through the limiting aperture member 206. The multiple beams 20 having passed through the limiting aperture member 206 are focused by the objective lens 207 to be a pattern image of a desired reduction rate. Then, the beams (the entire multiple beams 20) are collectively deflected in a same direction by the deflector 208 so as to irradiate respective irradiation positions on the target object 101. A reduction optical system is formed by the converging lens 205 and the objective lens 207.

While the XY stage 105 is continuously moving, it is controlled by the deflector 208 so that irradiation positions of beams may follow the movement of the XY stage 105, for example. The position of the XY stage 105 is measured by irradiating a laser light by the stage position detection unit 139 and receiving a catoptric light reflected by the mirror 210. The measured stage position is output to the writing control unit 60. Ideally, multi-beams 20 to irradiate at a time are aligned at pitches obtained by multiplying the arrangement pitch of a plurality of holes of the shaping aperture member 203 by a desired reduction ratio described above. The writing apparatus 100 performs a writing operation by the raster scan method which continuously irradiates shot beams in order, and when writing a desired pattern, a beam needed based on the pattern is controlled by blanking control to be "beam on".

Moreover, for example, a plurality of quadrangular electron beams (multiple beams) 28a and 28b for measurement (not for writing) are formed by letting portions of the electron beam 200, irradiating positions of a plurality of holes 23, pass through a corresponding hole of a plurality of holes 23 of the shaping aperture member 203 respectively.

As described above, compared with a single beam writing apparatus, in the case of a multiple beam writing apparatus, a plurality of shaping aperture openings are needed. Consequently, the size of the shaping aperture member 203 being a shaping aperture plate is large. The blanker array for blanking-controlling each beam of multiple beams may be united with the shaping aperture plate. Therefore, the structure becomes complicated. Thus, since the shaping aperture portion is large and the structure is complicated, a multi charge particle beam writing apparatus is easily affected by adherent contamination, and beam drift occurs easily compared with a single beam writing apparatus. For example, in the case of a single beam writing apparatus of a variable shaped beam system (VSB system), the position of a first shaping aperture image having passed the first shaping aperture can be adjusted on the second shaping aperture by a deflector. Therefore, the position accuracy of the first shaping aperture is can be corrected. However, in the case of the multi-beam writing apparatus, since the beam shaping is performed once, the position of the shaping aperture opening greatly affects the position accuracy when written on a target object surface. Therefore, if beam drift occurs at the shaping section of multiple beams, the position accuracy of each beam is degraded. When beam drift occurs, in addition to that the position of each beam is displaced, another problem may be generated in that a beam in the "on" state is partially blocked by the blanking aperture, thereby changing the dose reaching the target object. Thus, it is important to perform measurement and correction of the drift at the shaping section of multiple beams. Then, according to the first embodiment, using the multiple beams 28a and 28b for measurement, the amount of beam drift at the shaping section of multiple beams is measured, and the position of the multiple beams 20 for writing is corrected.

Figure 6:
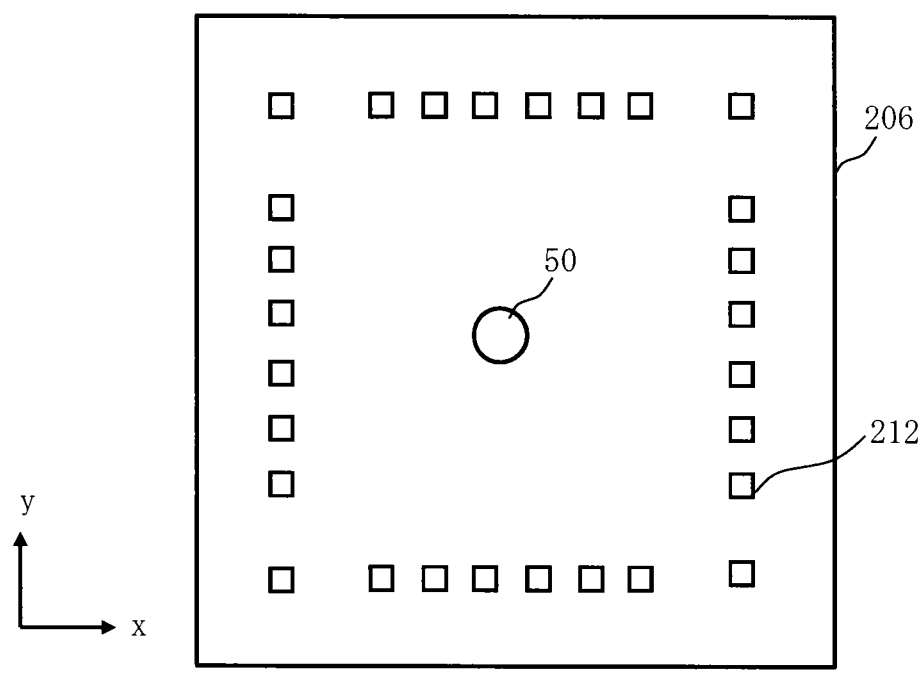
FIG. 6 is a top view showing an example of a limiting aperture member according to the first embodiment.

FIG. 6 is a top view showing an example of the limiting aperture member according to the first embodiment. For example, a circular hole 50 (limiting aperture) for letting the multiple beams 20 for writing to be "beam on" pass therethrough is formed at the central part of the limiting aperture member 206 (blanking aperture member). The limiting aperture member 206 is arranged such that the upper surface of the limiting aperture member 206 or the sectional center height of the hole 50 is close to the height position where the multiple beams 20 for writing and the multiple beams 28 for measurement form a crossover (c. o.). Therefore, the upper surface of the limiting aperture member 206 substantially becomes the surface of the crossover of the multiple beams 20 for writing and the multiple beams 28 for measurement. On the limiting aperture member 206, a plurality of mark members 212 are arranged around the hole 50. The detector 214 is not shown in FIG. 6. A plurality of mark members 212 are arranged according to the number of the multiple beams 28a and 28b for measurement.

The multiple beams 28a and 28b for measurement (not for writing) having passed the blanking plate 204 are converged by the converging lens 205, and advance toward the hole 50 at the center of the limiting aperture member 206. If the current state remains as it is, a crossover is formed at the position of the hole 50 similarly to the multiple beams 20 for writing. According to the first embodiment, the multiple beams 28a and 28b for measurement are individually deflected outside by a corresponding blanker. Deflection is performed toward outside with respect to the hole 50 so that a part of the beam may irradiate a corresponding mark member 212 even if the beam is converged by the converging lens 205.

When irradiating a corresponding mark member 212 with multiple beams 28 for measurement, a reflection electron and/or a secondary electron is emitted with respect to each beam. For each of the multiple beams 28 for measurement, a reflection electron and/or a secondary electron is detected by a corresponding detector 214, and the detection result is output to amplifier 130. Although one amplifier 130 is shown in the example of FIG. 1, it should be understood that amplifiers are to be arranged according to the number of detectors 214. According to the first embodiment, the space between each detector 214 and the limiting aperture member 206 is enclosed to be blocked, with the mark member 212 arranged thereinside. Thereby, it is possible to prevent a reflection electron and/or a secondary electron from leaking from the space between each detector 214 and the limiting aperture member 206, and thus their affecting the multiple beams 20 for writing can be avoided. The incidence port of each detector 214 should be open at the region where a corresponding beam of the multiple beams 28 for measurement enters. The measurement result is amplified by each amplifier 130, converted into a digital signal, and output to the measurement unit 60. Thereby, the position of the multiple beams 28 for measurement can be measured. If beam drift has occurred, the position which has been deviated by the beam drift is measured. By arranging each mark member 212 close to the crossover surface, each beam of the multiple beams 28 for measurement, being in a sharp shape, can irradiate a corresponding mark member 212. Therefore, even if the position deviation is minute, the current amount change to be measured can be enlarged. As a result, the position can be measured more highly accurately.

Figure 7:
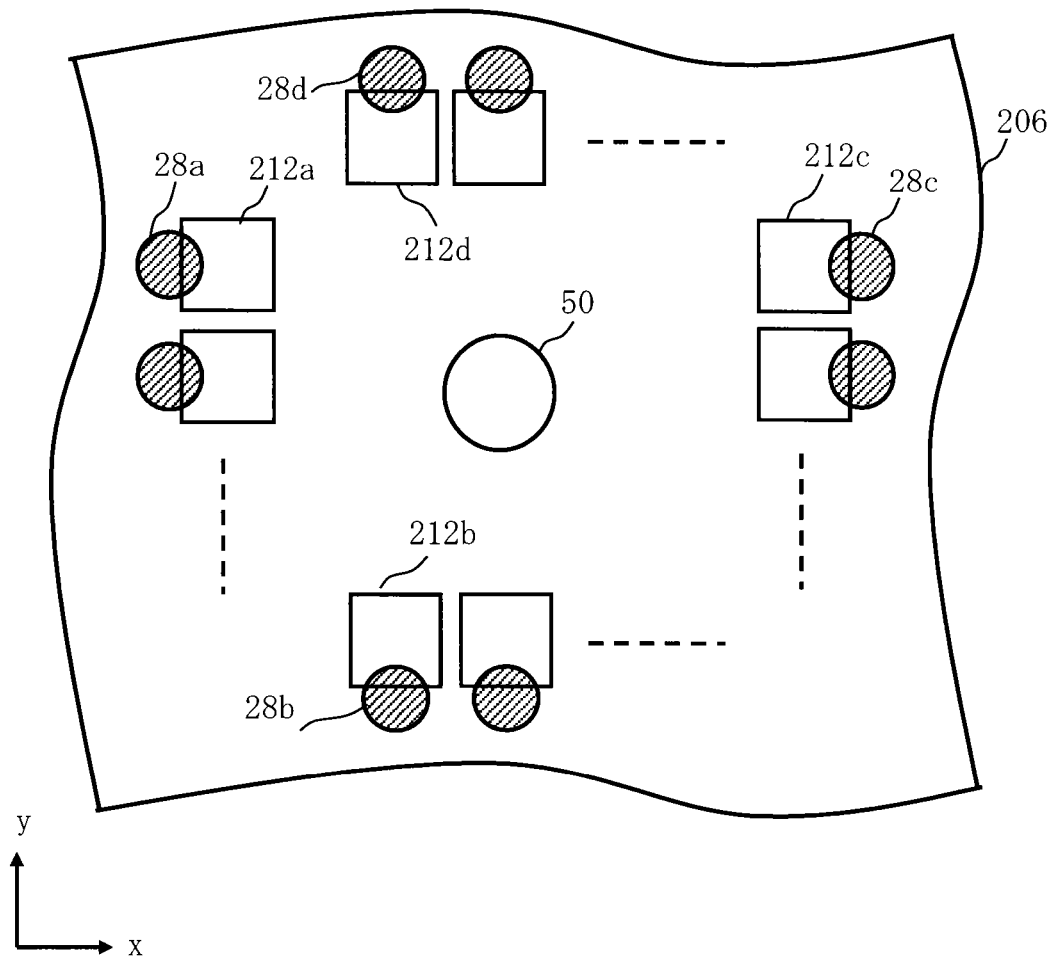
FIG. 7 shows an example of a beam irradiation position of multiple beams for measurement according to the first embodiment.

FIG. 7 shows an example of a beam irradiation position of multiple beams for measurement according to the first embodiment. In FIG. 7, the multiple beam 28a for measurement, on the −x direction side of the hole 50 at the center of the limiting aperture member 206, irradiates from above a corresponding mark member 212a such that a part of the beam spreads out in the −x direction. In other words, the multiple beam 28a for measurement is deflected such that a part of each beam irradiates the mark member 212a. Similarly, the multiple beams 28b for measurement, on the −y direction side of the hole 50 at the center of the limiting aperture member 206, irradiates from above a corresponding mark member 212b such that a part of the beam spreads out in the −y direction. In other words, the multiple beam 28b for measurement is deflected such that a part of each beam irradiates the mark member 212b. Similarly, the multiple beam 28c for measurement, on the x direction side of the hole 50 at the center of the limiting aperture member 206, irradiates from above a corresponding mark member 212c such that a part of the beam spreads out in the x direction. In other words, the multiple beam 28c for measurement is deflected such that a part of each beam irradiates the mark member 212c. Similarly, the multiple beam 28d for measurement, on the y direction side of the hole 50 at the center of the limiting aperture member 206, irradiates from above a corresponding mark member 212d such that a part of the beam spreads out in the y direction. In other words, the multiple beam 28d for measurement is deflected such that a part of each beam irradiates the mark member 212d.

Figure 8:
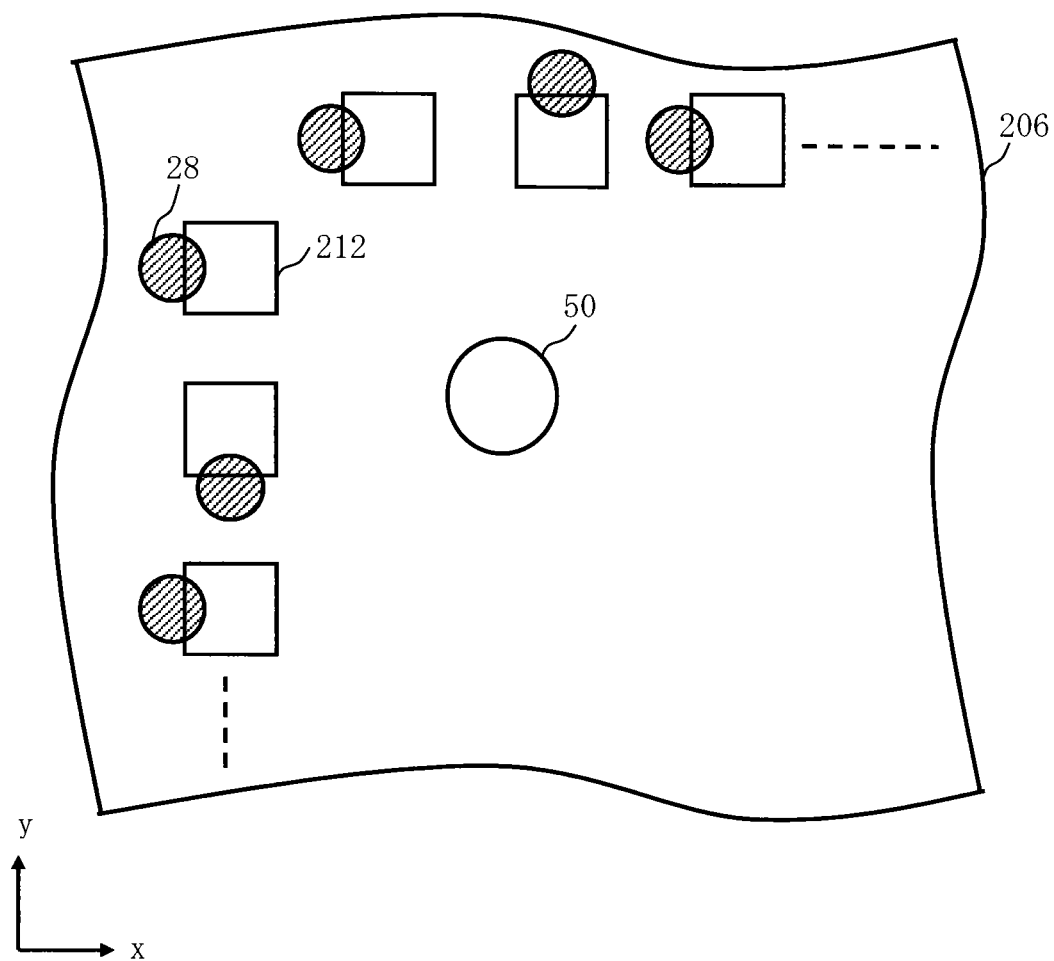
FIG. 8 shows another example of a beam irradiation position of multiple beams for measurement according to the first embodiment.

FIG. 8 shows another example of the beam irradiation position of multiple beams for measurement according to the first embodiment. In FIG. 8, with respect to the multiple beam 28a for measurement, on the −x direction side of the hole 50 at the center of the limiting aperture member 206, a part of the beam irradiates from above an each corresponding mark member 212a such that a part of it spreads out in the −x direction. Other beam of the multiple beam 28a for measurement, on the −x direction side of the hole 50, irradiates from above an each corresponding mark member 212a such that a part of it spreads out, for example, in the −y direction. For example, irradiation is performed in the y direction such that a part of the beam spreads out alternately in the −x direction and the −y direction.

Similarly, with respect to the multiple beam 28b for measurement, on the −y direction side of the hole 50 at the center of the limiting aperture member 206, a part of the beam irradiates from above an each corresponding mark member 212b such that a part of it spreads out in the −y direction. Other beam of the multiple beam 28b for measurement, on the −y direction side of the hole 50, irradiates from above an each corresponding mark member 212b such that a part of it spreads out, for example, in the x direction. For example, irradiation is performed in the x direction such that a part of the beam spreads out alternately in the −y direction and the x direction.

Similarly, with respect to the multiple beam 28c for measurement, on the x direction side of the hole 50 at the center of the limiting aperture member 206, a part of the beam irradiates from above an each corresponding mark member 212c such that a part of it spreads out in the x direction. Other beam of the multiple beam 28c for measurement, on the x direction side of the hole 50, irradiates from above an each corresponding mark member 212c such that a part of it spreads out, for example, in the y direction. For example, irradiation is performed in the y direction such that a part of the beam spreads out alternately in the x direction and the y direction.

Similarly, with respect to the multiple beam 28d for measurement, on the y direction side of the hole 50 at the center of the limiting aperture member 206, a part of the beam irradiates from above an each corresponding mark member 212d such that a part of it spreads out in the y direction. Other beam of the multiple beam 28d for measurement, on the y direction side of the hole 50, irradiates from above an each corresponding mark member 212d such that a part of it spreads out, for example, in the −x direction. For example, irradiation is performed in the x direction such that a part of the beam spreads out alternately in the y direction and the −x direction.

As shown in FIG. 8, errors depending on positions, etc. can be reduced by performing measurement such that it spreads out alternately in the x and the y directions of the mark member 212. According to the method of FIG. 8, positions of the whole perimeter can be measured with respect to the x and the y directions. Accordingly, data bias depending upon positions can be eliminated. Therefore, the precision of drift correction can be increased compared with the method shown in FIG. 7.

The multiple beams 20 for writing are corrected using measured positions as described above. Hereafter, the flow of writing processing will be explained in order.

Figure 9:
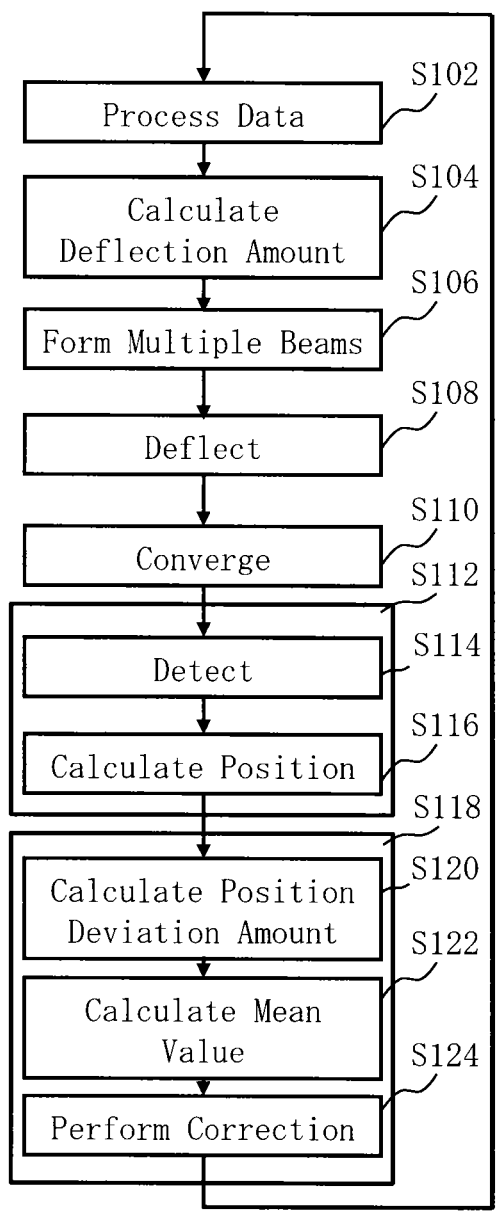
FIG. 9 is a flowchart showing main steps of a writing method according to the first embodiment.

FIG. 9 is a flowchart showing main steps of a writing method according to the first embodiment.

First, in a data processing step (S102), the writing data processing unit 64 reads writing data from the storage device 140, and generates apparatus-specific shot data. In the shot data, there is included information on whether a corresponding beam of the multiple beams 20 for writing is "beam on" or "beam off" in accordance with the position on the target object 101. Moreover, information on the irradiation time (dose) in the case of "beam on" is included. The generated shot data is output to the deflection control circuit 120.

In a deflection amount calculation step (S104), the deflection amount calculation unit 70 calculates a deflection amount for making each beam of the multiple beams 20 for writing be "beam on" and a deflection amount for making it be "beam off". Generally, a voltage of 0V is applied when making it be "beam on". When making it be "beam off", a voltage $V_1$ that can deflect the beam to be displaced from the hole 50 of the limiting aperture 206 is applied. The deflection direction for blanking may be in the x direction or the y direction.

In a multi-beam forming step (S106), the multiple beams 20 for writing and the multiple beams 28 for measurement are formed by the method described above.

In a deflection step (S108), blanking deflection is performed for a corresponding beam of the multiple beams 20 for writing and the multiple beams 28 for measurement respectively by using a plurality of blankers arranged at the blanking plate 204. In that case, concerning the multiple beams 28 for measurement, deflection is performed such that a part of the beam overlaps on the mark member 212 as described above.

In a convergence step (S110), the converging lens 205 converges the multiple beams 20 for writing and the multiple beams 28 for measurement, which have passed the individual blanking plate 204, toward a crossover position.

By the method described above, each beam which was deflected to be in the "beam off" state by a plurality of blankers in the multiple beams 20 for writing is blocked at the position displaced from the hole 50, and each beam to be in the "beam on" state is let to pass through the hole 50.

Simultaneously, in a measurement step (S112), the measurement unit 60 measures positions of the multiple beams 28 for measurement by the method described above using a plurality of mark members 212. In a detection step (S114), as an internal step of the measurement step (S112), a reflection electron or a secondary electron emitted from a corresponding mark member 212 by irradiation of the multiple beams 28 for measurement which have passed without being deflected by a plurality of blankers is detected using a plurality of detectors 214. In a position calculation step (S116), the measurement unit 60 calculates a position of the multiple beams 28 for measurement by using a detection result.

In a correction step (S118), the correction unit 68 corrects a voltage to be applied to make a "beam on" state to each blanker which performs blanking deflection for the multiple beams 20 for writing in a plurality of blankers, in order to correct a deviation amount of a measured position of the multiple beams 28 for measurement. Specifically, it operates as follows. In a position deviation amount calculation step (S120), the position deviation amount calculation unit 62 inputs position information on each measured beam of the multiple beams 28 for measurement, and calculates a position deviation amount from a design position (position where no beam drift has occurred). In a mean value calculation step (S122), the correction unit 68 inputs a position deviation amount of each beam of the multiple beams 28 for measurement, and calculates a mean value of the position deviation amount of each beam at the measured position of multiple beams 28 for measurement. In a correction processing step (S124), the correction unit 68 corrects deflection amount data (deflection voltage data) used when making each beam of the multiple beams 20 for writing be "beam on" by using mean value data. The deflection amount data is output to the deflection control circuit 120. When calculating a deflection amount used in making a "beam on" state, the deflection amount calculation unit 70 calculates a deflection amount (deflection voltage) based on the corrected deflection amount data. Thereby, the deflection voltage used when making a "beam on" state is corrected. Since both the x direction data and the y direction data exist as a position deviation amount, a mean value with respect to the x direction and a mean value with respect to the y direction are to be used. The deflection control circuit 120 outputs data obtained by adding (offsetting) a mean value of the position deviation amount in the x direction to the x driver 31 for each beam of the multiple beams 20 for writing. The deflection control circuit 120 outputs data obtained by adding (offsetting) a mean value of the position deviation amount in the y direction to the y driver 29 for each beam of the multiple beams 20 for writing.

The correction value is not limited to the mean value described above. For example, the correction unit 68 may calculate a position deviation amount in accordance with the position of each beam of the multiple beams 20 for writing by linear interpolation by using a position deviation amount of each beam at the measured position of the multiple beams 28 for measurement. It is also preferable, for each beam of the multiple beams 20 for writing, to correct deflection amount data (deflection voltage data) used when making each beam of the multiple beams 20 for writing be "beam on" in order to correct each calculated position deviation amount. Then, when calculating a deflection amount to make a "beam on" state, the deflection amount calculation unit 70 calculates a deflection amount (deflection voltage) based on the corrected deflection amount data. Thereby, the deflection voltage for making a "beam on" state can be individually corrected for each beam of the multiple beams 20 for writing. Therefore, the precision of drift correction can be increased compared with the case of using a mean value.

In a deflection step after offset, when making each beam, which is to be shot, in the multiple beams 20 for writing be in a "beam on" state, a corresponding blanker deflects each beam of the multiple beams 20 for writing to the position where the drift position was corrected.

With respect to the multiple beams for measurement, the position of each beam can be measured any time or at each shot of the multiple beams 20 for writing. Therefore, in advancing writing processing, the beam drift can be corrected in real time. For example, the beam drift can be corrected for each shot of the multiple beams 20 for writing.

Figure 10A:
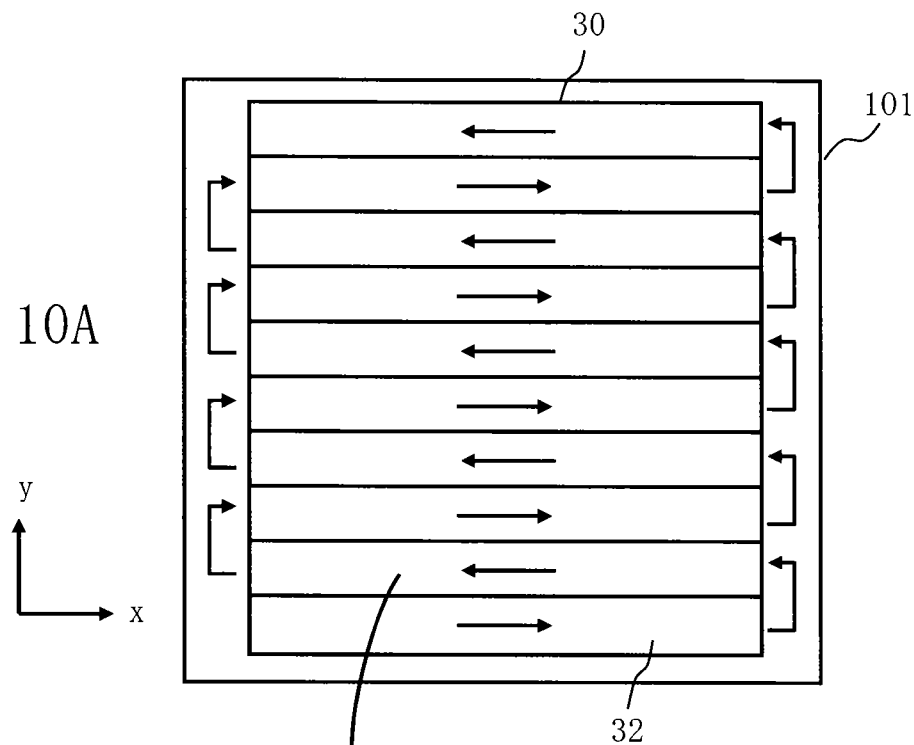
FIGS. 10A to 10C are conceptual diagrams explaining a writing operation according to the first embodiment.
Figure 10B:
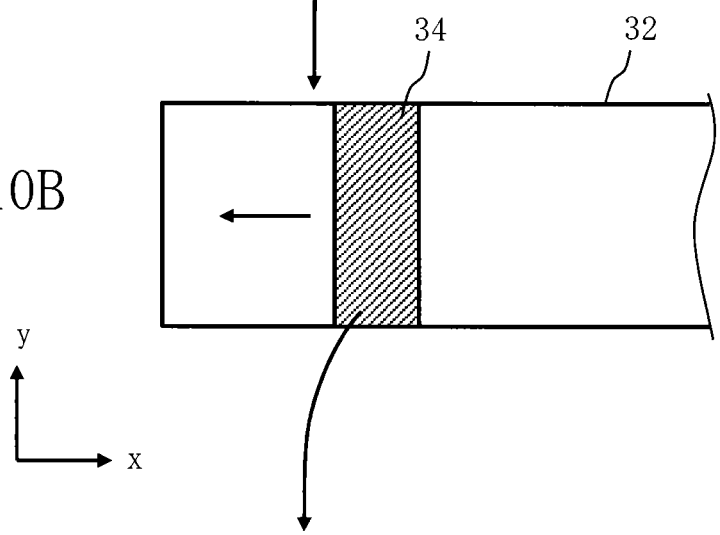
Figure 10C:
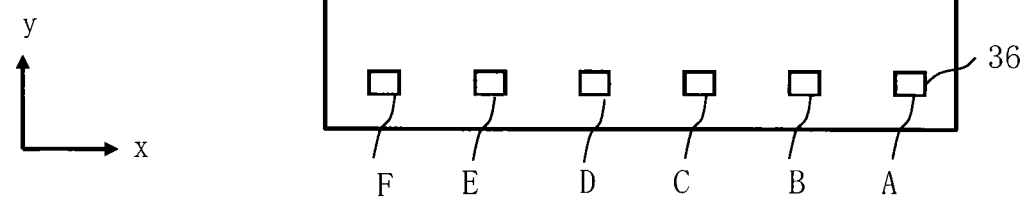

FIGS. 10A to 10C are conceptual diagrams explaining a writing operation according to the first embodiment. As shown in FIG. 10A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end to be relatively located in the y direction. Then, similarly, as shown in FIG. 10B, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. By one shot, as shown in FIG. 10C, a plurality of shot patterns 36 of the same number as the holes 22 are formed at a time by multiple beams which have been formed bypassing through respective corresponding holes 22 of the aperture member 203. For example, a beam which passed through one hole A of the aperture member 203 irradiates the position "A" shown in FIG. 100 and forms a shot pattern 36 at this position. Similarly, a beam which passed through one hole B of the aperture member 203 irradiates the position "B" shown in FIG. 100 and forms another shot pattern 36 at this position, for example. Hereafter, a similar operation is performed with respect to C to H. The writing apparatus 100 performs writing of each stripe 32 by the raster scan method that performs deflection such that each shot moves (scans) in the y direction or the x and y directions in order by the deflector 208 and continuously irradiates shot beams in order while moving the XY stage 105 in the x direction.

The case in which beam drift correction using multiple beams for measurement is performed in real time has been described in the above examples, it is not limited thereto. For example, it is also preferable to perform correction for each stripe region 32. Alternatively, it is also preferable to perform correction for each target object in the case of writing a plurality of target objects 101 in order.

Figure 11:
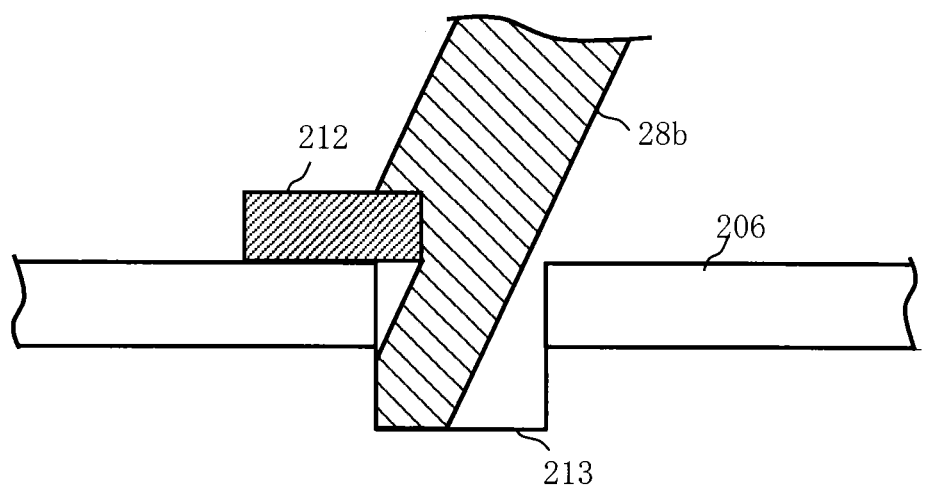
FIG. 11 shows another example of a detector according to the first embodiment.

FIG. 11 shows another example of a detector according to the first embodiment. The case of detecting, by the detector 214, a reflection electron or a secondary electron generated when the multiple beams 28 for measurement irradiate the mark member 212 and the limiting aperture member 206 is described in FIG. 1, but however, it is not limited thereto. As shown in FIG. 11, a Faraday cup 213 may be arranged below the mark member 212. It is preferable to arrange the Faraday cup 213 to be overlapped with a part of the mark member 212. A part of the multiple beams 28 for measurement which was not blocked by the mark member 212 enters the Faraday cup 213. By measuring the amount of the beam current which entered the Faraday cup 213, a beam position in accordance with the current amount can be calculated. Therefore, a beam position can be measured by measuring the amount of current entered the Faraday cup 213.

As described above, according to the first embodiment, the drift correction can be performed at the shaping section of multiple beams in multi-beam writing. Consequently, it is possible to prevent a part of a beam in the "on" state of the multiple beams 20 from being blocked by the limiting aperture member 206 due to the beam drift. Therefore, change of the dose amount of a beam reaching the target object 101 can be reduced or controlled.

Second Embodiment

In the first embodiment, the case in which the position of the multiple beams 28 for measurement is measured near the height position of the crossover surface has been described, but however, it is not limited thereto. In the second embodiment, the case in which the position of the multiple beams 28 for measurement is measured at a position in the middle to the crossover position will be described.

Figure 12:
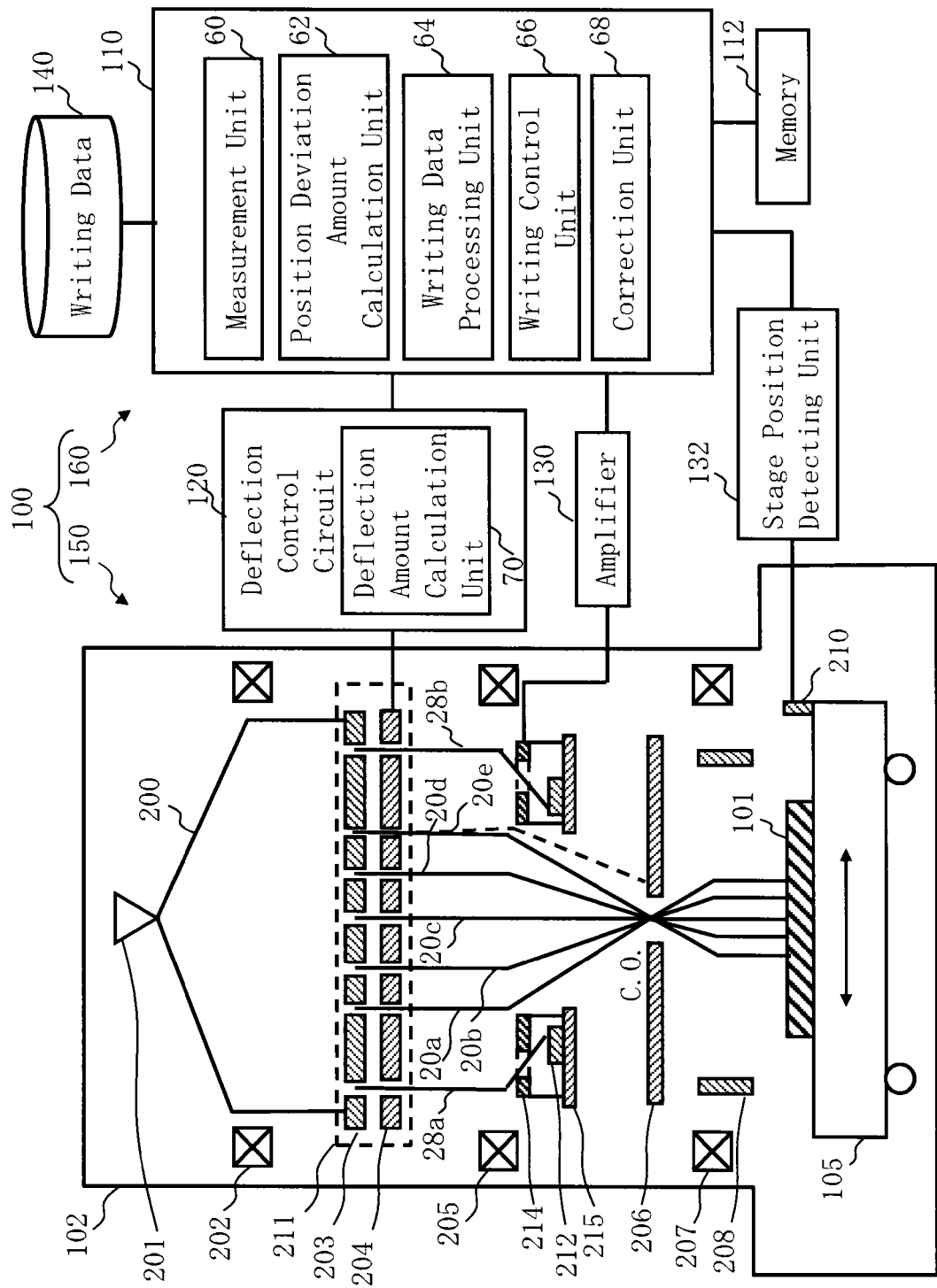
FIG. 12 is a schematic diagram showing the structure of a writing apparatus according to the second embodiment.

FIG. 12 is a schematic diagram showing the structure of a writing apparatus according to the second embodiment. FIG. 12 is the same as FIG. 1 except that a plurality of mark members 212 are arranged between the blanking plate 204 and the limiting aperture member 206, and a measurement plate 215 (support member) which supports a plurality of mark members 212 is arranged. The contents of the second embodiment are the same as those of the first embodiment except what is particularly described below. One measurement plate 215 in which an opening is formed at the central part may support a plurality of mark members 212, or the measurement plate 215 may be arranged for each mark member 212. Alternatively, a plurality of mark members 212 are divided into a plurality of groups, and the measurement plate 215 may be arranged for each group.

In the example of FIG. 12, a plurality of mark members 212 are arranged between the converging lens 205 and the limiting aperture member 206. On the measurement plate 215, there are arranged a plurality of mark members 212 and a plurality of detectors 214 each arranged for each mark member 212. According to the second embodiment, as shown in FIG. 12, each of the multiple beams 28 for measurement is let to pass through, without being deflected by the blanker of the blanking plate 204. Then, each beam is converged by the converging lens 205 to be crossovered at the hole 50 of the limiting aperture member 206. Each mark member 212 is arranged in the middle of the trajectory along which a corresponding beam of the multiple beams 28 for measurement, having passed without being deflected by the blanker of the blanking plate 204, advances to the crossover position after being converged. Therefore, it is unnecessary for the multiple beams 28 for measurement to be deflected by the blanker of the blanking plate 204. Furthermore, the blanker of the blanking plate 204 can be eliminated with respect to the multiple beams 28 for measurement.

A plurality of mark members 212 may be arranged between the blanking plate 204 and the converging lens 205.

According to the second embodiment, the drift correction can be performed at the shaping section of multiple beams in multi-beam writing similarly to the first embodiment. Consequently, it is possible to prevent a part of a beam in the "on" state of the multiple beams 20 from being blocked by the limiting aperture member 206 due to beam drift. Therefore, change of the dose amount of a beam reaching the target object 101 can be reduced or controlled.

Even when each beam of the multiple beams 28 for measurement is shaped to a quadrangle by the hole 23 of the shaping aperture member 203, it becomes circular at the height position of the crossover surface. On the other hand, as shown in FIG. 12, it is possible to keep each beam to be approximately a quadrangle while being converged. Therefore, according to the second embodiment, positions can be measured using a quadrangular beam. Consequently, position specification (calculation) can be easily performed compared with the case of measuring a position by using a circular beam.

The embodiments have been explained referring to concrete examples described above. However, the present invention is not limited to these specific examples. The raster scanning operation described above is just an example, and it is also acceptable to use other operation method instead of the raster scanning operation using multiple beams. Moreover, in the example described above, the shaping aperture member 204 and the blanking plate 204 are united to form an integral structure by the BAA member 211, it is not limited thereto. The shaping aperture member 204 and the blanking plate 204 may be arranged separately.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
an emission unit configured to emit a charged particle beam;
a beam forming member, in which a plurality of first openings for writing and a plurality of second openings not for writing around the plurality of first openings are formed, configured to form multiple beams for writing by letting a region including a whole of the plurality of first openings and the plurality of second openings be irradiated with the charged particle beam and letting portions of the charged particle beam respectively pass through a corresponding opening of the plurality of first openings, and to form multiple beams for measurement by letting portions of the charged particle beam respectively pass through the plurality of second openings;
a blanking plate having a plurality of blankers configured to respectively perform blanking deflection for a corresponding beam in the multiple beams for writing having passed through the plurality of first openings and the multiple beams for measurement having passed through the plurality of second openings of the beam forming member;
a converging lens configured to converge the multiple beams for writing and the multiple beams for measurement which have passed through the blanking plate;
a blanking aperture member, which is arranged close to a height position where the multiple beams for writing and the multiple beams for measurement form a crossover and in which a limiting aperture is formed, configured to block each beam in the multiple beams for writing, which was deflected to be in a "beam off" state by one of the plurality of blankers, at a position displaced from the limiting aperture, and to let each beam to be in a "beam on" state pass through the limiting aperture;
a plurality of mark members arranged on the blanking aperture member, which is arranged close to the height position where the crossover is formed, or arranged between the blanking aperture member and the blanking plate;
a measurement unit configured to measure positions of the multiple beams for measurement by using the plurality of mark members; and
a correction unit configured to correct a voltage for making a "beam on" state to be applied to one of the plurality of blankers, which performs blanking deflection for one of the multiple beams for writing, in order to correct a position deviation amount of a measured position in the positions of the multiple beams for measurement.

2. The apparatus according to claim 1, wherein the correction unit corrects the voltage by using a mean value of the position deviation amount of each beam at the measured position in the positions of the multiple beams for measurement.

3. The apparatus according to claim 1, wherein the correction unit calculates a position deviation amount in accordance with a position of each beam of the multiple beams for writing, by linear interpolation by using the position deviation amount of each beam at the measured position in the positions of the multiple beams for measurement, and individually corrects the voltage in order to correct a calculated position deviation amount, for the each beam of the multiple beams for writing.

4. The apparatus according to claim 1, wherein each of the plurality of blankers is arranged to be able to deflect a corresponding beam in at least two directions not being parallel each other.

5. The apparatus according to claim 1, wherein the measurement unit includes a plurality of Faraday cups, which are arranged below the plurality of mark members.

6. The apparatus according to claim 1, further comprising:
a plurality of detectors configured to respectively detect a reflection electron or a secondary electron emitted from a corresponding mark member in the plurality of mark members.

7. The apparatus according to claim 6, wherein in a case in which the plurality of mark members are arranged on the blanking aperture member, a space between each detector of the plurality of detectors and the blanking aperture member is enclosed, with a corresponding mark member arranged thereinside.

8. The apparatus according to claim 6, wherein, in a case in which the plurality of mark members are arranged on the blanking aperture member, the plurality of detectors each detect the reflection electron or the secondary electron emitted from the corresponding mark member by irradiation of the multiple beams for measurement which have been deflected by the plurality of blankers.

9. The apparatus according to claim 6, wherein, in a case in which the plurality of mark members are arranged between the blanking aperture member and the blanking plate, the plurality of detectors each detect the reflection electron or the secondary electron emitted from the corresponding mark member by irradiation of the multiple beams for measurement which have passed without being deflected by the plurality of blankers.

10. The apparatus according to claim 1, further comprising:
a support member configured to support the plurality of mark members in a case in which the plurality of mark members are arranged between the blanking aperture member and the blanking plate.

11. The apparatus according to claim 1, further comprising:
a plurality of support members configured to respectively support a corresponding mark member in the plurality of mark members in a case in which the plurality of mark members are arranged between the blanking aperture member and the blanking plate.

12. A multi charged particle beam writing method comprising:
emitting a charged particle beam;
forming multiple beams for writing, by using a beam forming member in which a plurality of first openings for writing and a plurality of second openings not for writing around the plurality of first openings are formed, by letting a region including a whole of the plurality of first openings and the plurality of second openings be irradiated with the charged particle beam and letting portions of the charged particle beam respectively pass through a corresponding opening of the plurality of first openings, and forming multiple beams for measurement by letting portions of the charged particle beam respectively pass through the plurality of second openings;
performing blanking deflection for a corresponding beam in the multiple beams for writing having passed through the plurality of first openings and the multiple beams for measurement having passed through the plurality of second openings, by using a plurality of blankers arranged in a blanking plate;

converging the multiple beams for writing and the multiple beams for measurement which have passed through the blanking plate;

blocking each beam in the multiple beams for writing, which was deflected to be in a "beam off" state by one of the plurality of blankers, at a position displaced from a limiting aperture, and letting each beam to be in a "beam on" state pass through the limiting aperture, by using a blanking aperture member which is placed close to a height position where the multiple beams for writing and the multiple beams for measurement form a crossover and in which the limiting aperture is formed;

measuring positions of the multiple beams for measurement by using a plurality of mark members arranged on the blanking aperture member placed close to the height position where the crossover is formed, or arranged between the blanking aperture member and the blanking plate; and correcting a voltage for making a "beam on" state to be applied to one of the plurality of blankers, which performs blanking deflection for one of the multiple beams for writing, in order to correct a position deviation amount of a measured position in the positions of the multiple beams for measurement.

13. The method according to claim 12, wherein the correcting the voltage is performed by using a mean value of the position deviation amount of each beam at the measured position in the positions of the multiple beams for measurement.

14. The method according to claim 12, further comprising:
calculating a position deviation amount in accordance with a position of each beam of the multiple beams for writing by linear interpolation by using the position deviation amount of each beam at the measured position in the positions of the multiple beams for measurement,
wherein the voltage is individually corrected in order to correct a calculated position deviation amount, for the each beam of the multiple beams for writing.

15. The method according to claim 12, wherein the measuring positions of the multiple beams for measurement includes detecting a reflection electron or a secondary electron emitted from a corresponding mark member in the plurality of mark members by irradiation of the multiple beams for measurement which have been deflected by the plurality of blankers, by using a plurality of detectors, in a case in which the plurality of mark members are arranged on the blanking aperture member.

16. The method according to claim 12, wherein the measuring positions of the multiple beams for measurement includes detecting a reflection electron or a secondary electron emitted from a corresponding mark member in the plurality of mark members by irradiation of the multiple beams for measurement which have passed without being deflected by the plurality of blankers, by using a plurality of detectors, in a case in which the plurality of mark members are arranged between the blanking aperture member and the blanking plate.

17. A multi charged particle beam writing apparatus comprising:

an emission means for emitting a charged particle beam;

a beam forming member, in which a plurality of first openings for writing and a plurality of second openings not for writing around the plurality of first openings are formed, configured to form multiple beams for writing by letting a region including a whole of the plurality of first openings and the plurality of second openings be irradiated with the charged particle beam and letting portions of the charged particle beam respectively pass through a corresponding opening of the plurality of first openings, and to form multiple beams for measurement by letting portions of the charged particle beam respectively pass through the plurality of second openings;

a blanking plate having a plurality of blankers configured to respectively perform blanking deflection for a corresponding beam in the multiple beams for writing having passed through the plurality of first openings and the multiple beams for measurement having passed through the plurality of second openings of the beam forming member;

a converging means for converging the multiple beams for writing and the multiple beams for measurement which have passed through the blanking plate;

a blanking aperture member, which is arranged close to a height position where the multiple beams for writing and the multiple beams for measurement form a crossover and in which a limiting aperture is formed, configured to block each beam in the multiple beams for writing, which was deflected to be in a "beam off" state by one of the plurality of blankers, at a position displaced from the limiting aperture, and to let each beam to be in a "beam on" state pass through the limiting aperture;

a plurality of mark members arranged on the blanking aperture member, which is arranged close to the height position where the crossover is formed, or arranged between the blanking aperture member and the blanking plate;

a measurement means for measuring positions of the multiple beams for measurement by using the plurality of mark members; and a correction means for correcting a voltage for making a "beam on" state to be applied to one of the plurality of blankers, which performs blanking deflection for one of the multiple beams for writing, in order to correct a position deviation amount of a measured position in the positions of the multiple beams for measurement.

* * * * *